United States Patent [19]
Manku et al.

[11] Patent Number: 5,508,631
[45] Date of Patent: Apr. 16, 1996

[54] SEMICONDUCTOR TEST CHIP WITH ON WAFER SWITCHING MATRIX

[75] Inventors: Tajinder Manku, Nepean; Wenyi Song, Ottawa, both of Canada

[73] Assignee: Mitel Corporation, Kanata, Canada

[21] Appl. No.: 329,416

[22] Filed: Oct. 27, 1994

[51] Int. Cl.⁶ .......................... G01R 31/02; G01R 31/28
[52] U.S. Cl. .................. 324/763; 324/158.1; 371/22.2
[58] Field of Search ................. 324/731, 158.1, 324/765, 763; 371/22.2, 22.3, 25.1, 15.1; 340/825.84, 825.91

[56] References Cited

U.S. PATENT DOCUMENTS

| | | | |
|---|---|---|---|
| 4,719,411 | 1/1988 | Buehler | 324/73.1 |
| 4,800,332 | 1/1989 | Hutchins | 324/73.1 |
| 4,864,165 | 9/1989 | Hoberman et al. | 324/73.1 |
| 5,309,091 | 5/1994 | El-Ayat et al. | 324/73.1 |

*Primary Examiner*—Vinh P. Nguyen
*Attorney, Agent, or Firm*—Marks & Clerk

[57] ABSTRACT

A semiconductor test chip has an array of active semiconductor devices to be individually tested, a number of test lines for connection to external test circuitry, an enabling circuit associated with each device for selectively connecting it to the test lines, an input for receiving an instruction identifying a device that it is desired to test, and a decoder incorporated into the chip for receiving the instruction from the input. The decoder is connected by enabling lines to the individual test devices so that on receipt of an instruction the decoder enables the identified test device such that it becomes connected to the test lines. This circuit is more efficient and less cumbersome than the prior art.

9 Claims, 4 Drawing Sheets

5,508,631

SEMICONDUCTOR TEST CHIP WITH ON WAFER SWITCHING MATRIX

BACKGROUND OF THE INVENTION

1. Field of the Invention

This invention relates to integrated circuits, and more particularly to a semiconductor test chip.

2. Description of the Prior Art

The current approach to designing a test chip, for example for the purpose of D.C. device parameter extraction, is to provide dedicated contact pads for the terminals of all the various test devices on the chip. Consequently the number of contact pads is proportional to the number of test devices. Furthermore, to access one device, the correct pads have to be accessed using an exterior switch matrix controller. As a result the circuit is complex and the number of devices that can be incorporated limited by the physical size of the contact pads.

An object of the present invention is to alleviate the afore-mentioned disadvantage of the prior art.

SUMMARY OF THE INVENTION

According to the present invention there is provided a semiconductor test chip comprising an array of active semiconductor devices to be individually tested; a plurality of test lines for connection to external test circuitry; enabling means associated with each device for selectively connecting it to said test lines; input means for receiving an instruction identifying a device to be tested; and decoder means incorporated into said chip for receiving said instruction from said input means, said decoder means being connected by enabling lines to said individual test devices so that on receipt of an instruction said decoder means enables the identified test device such that it becomes connected to said test lines.

In the above scheme, a switch matrix controller is no longer necessary, and the number of contact pads is now proportional to the base two logarithmic of the number of test devices (i.e. more test devices can be put onto the same chip area). In addition, the new scheme requires less initial setup up time and less testing time.

A particularly advantageous aspect of the invention is that the addressing scheme permits the enablement of the terminals of only one device. Consequently, the D.C. characteristics of that particular device can be extracted.

In this scheme, the matrix of semiconductor devices, e.g. NMOS transistors, along with its access controlling circuitry are placed on one chip for the purpose of D.C. parametric extraction. The devices in the matrix may have different layout depending on the requirements of the extraction.

The invention will now be described in more detail, by way of example only, with reference to the accompanying drawings, in which.

Figure 1:
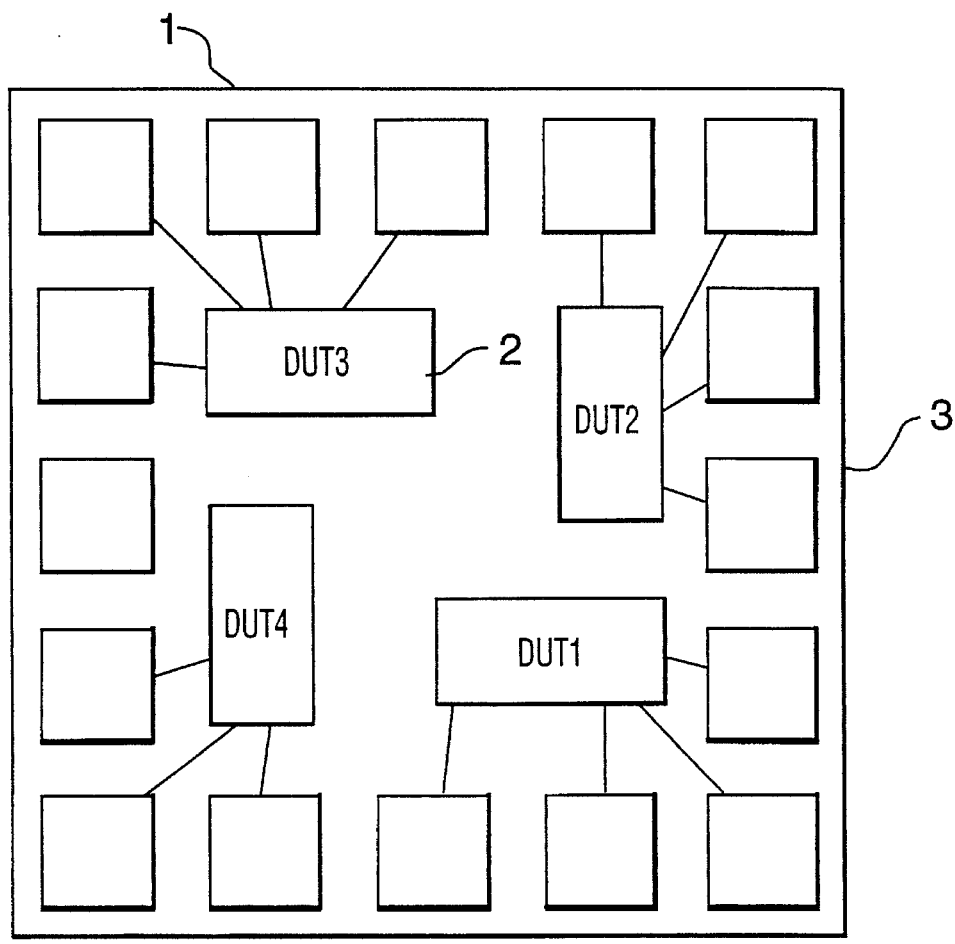
FIG. 1 is a plan view of a prior art test chip.
Figure 2:
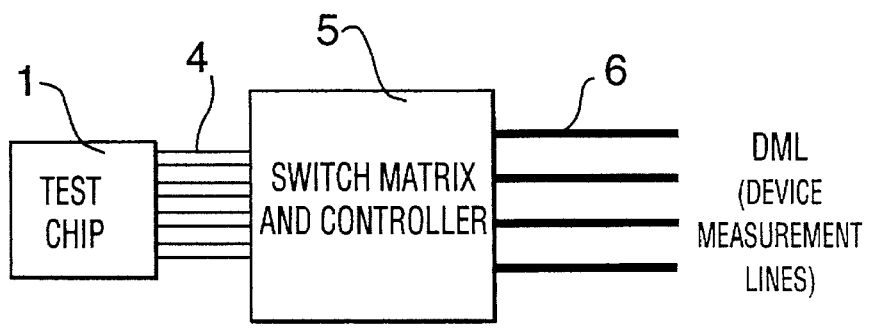
FIG. 2 is a block diagram of a circuit arrangement incorporating a prior art test chip.

Referring now to FIGS. 1 and 2, the prior art test chip 1 comprises an arbitrary arrangement of active devices under test 2 (DUT1–DUT4), each connected to four contact pads 3. The pads 3 are connected by respective lines 4 to switch matrix and controller 5, which in turn has a plurality of DML (device measurement lines 6).

In operation, the switch matrix and controller 5, which is external to the chip, selects the lines that are connected to the desired DUT 2 and connects them to the DML lines 6.

The switch controller and matrix 5 is relatively cumbersome, and because of the need to have a set of contact pads 3 connected to each DUT 2, the number of DUTs 2 that can be accommodated is limited.

Figure 3:
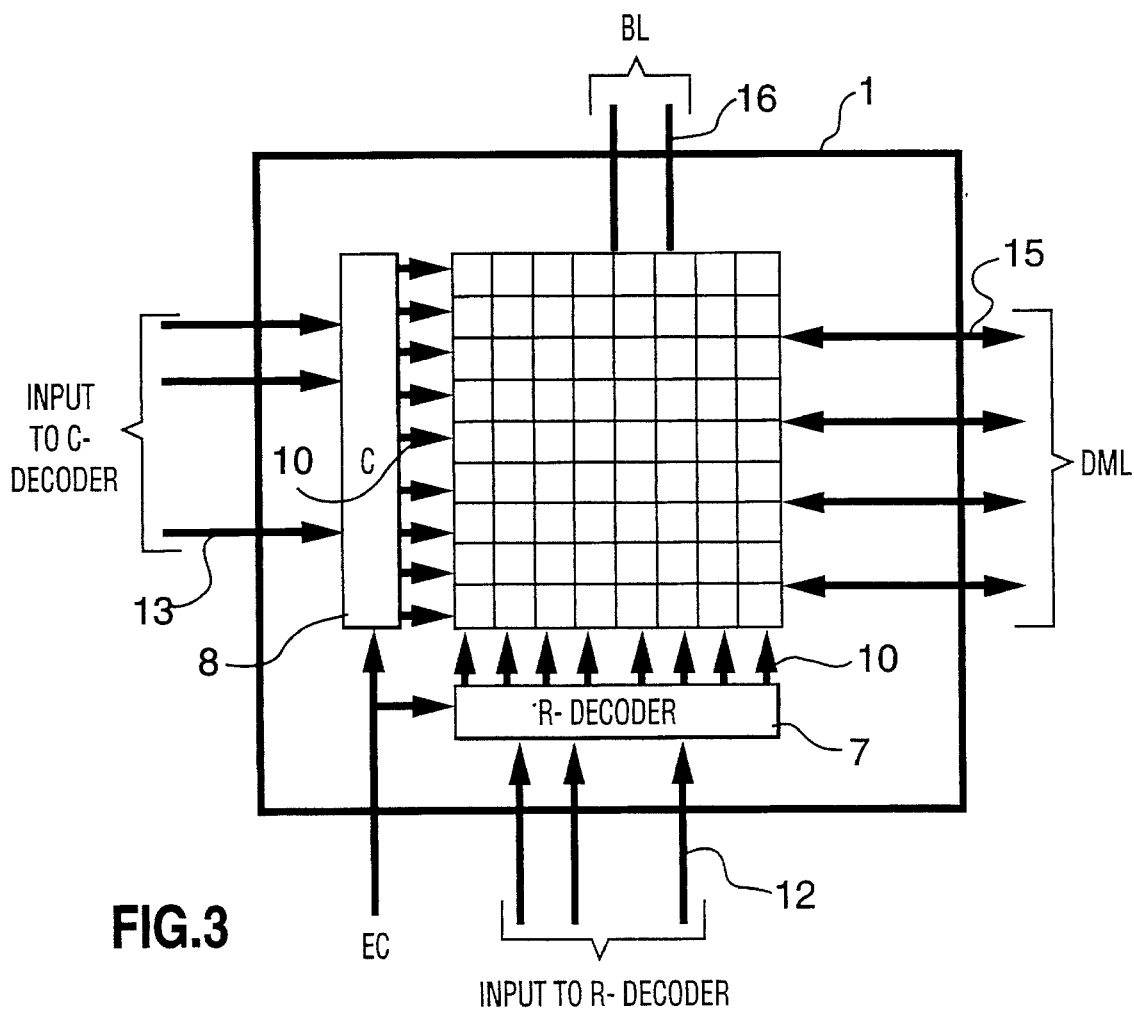
FIG. 3 is a plan view of a test chip in accordance with the invention.

Referring now to FIG. 3, the chip 1 comprises a rectangular matrix of DUTs (not shown) at the intersection of the rows and columns of the matrix. In addition, the chip 1 comprises a row decoder 7 and a column decoder 8, each receiving instruction words on input lines 12, 13 identifying a device that it is desired to test. The decoders 7, 8 activate respective row and column enabling lines 10, 11 to designate the particular device which then becomes enabled.

The devices under test (DUTs) 2 are each connected via the enabling circuitry 14 (FIG. 4) to the device measurement lines (DMLs) 15 connected to external test circuitry. The DMLs 15 constitute the input/output terminals for the DUT.

The bias lines (BL) 16 are used to bias the enabling circuit within each device and/or the decoders 7, 8.

The chip incorporates decoding circuitry which is used to select a matrix element as the Device Under Test (DUT). The decoding circuitry on the bottom of the matrix enables the row, labelled R, and the circuitry on the left enables the column, labelled C.

Figure 4:
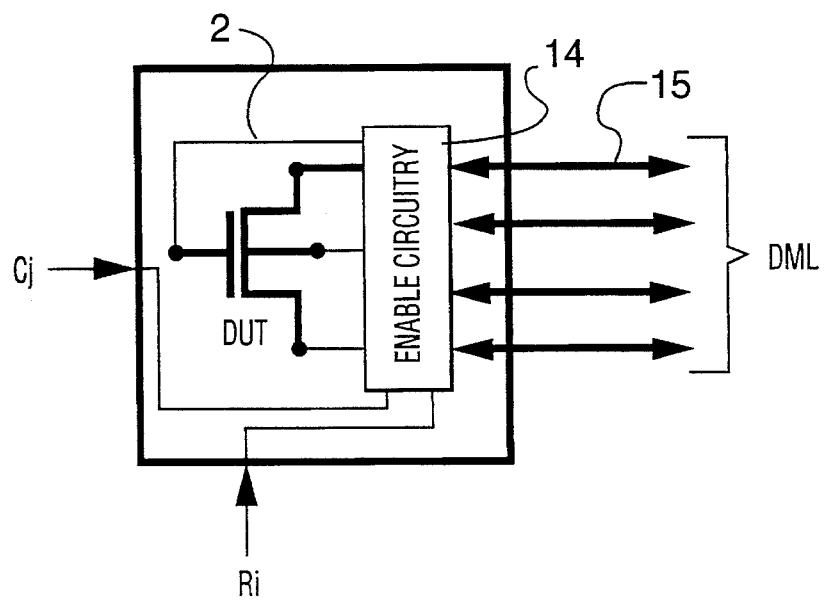
FIG. 4 is a block diagram of an active device with its enabling circuitry.

In operation, instruction words are applied to the inputs 12, 13 of the decoders 7, 8, which enable the appropriate lines $R_i$, $C_j$, of the lines 10, 11. As shown in FIG. 4, these enable the enabling circuitry 14, which connects the DUT 2 to the DMLs 15.

The line labelled EC (enable chip) is used to enable the chip to access the matrix.

The DUT can, for example, be a MOS transistor, in which case the DMLs include the source, gate, bulk (or substrate), and drain.

In FIG. 4, when the enabling circuit is activated by the lines $C_j$ and $R_i$, the enabling circuit is set on and the device characteristics can be measured through the DML lines 15.

Figure 5:
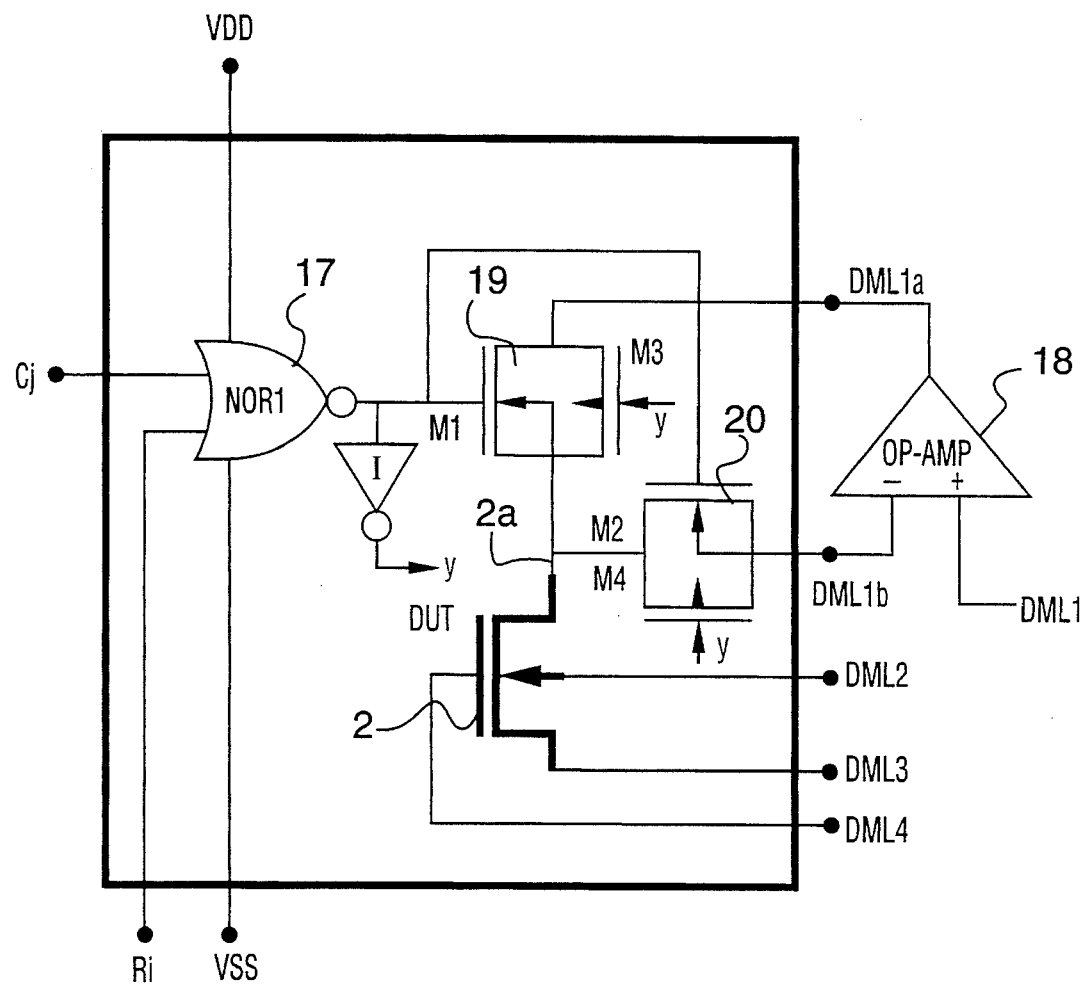
FIG. 5 is a more detailed block diagram of a first embodiment of an active device showing the enabling circuitry.
Figure 6:
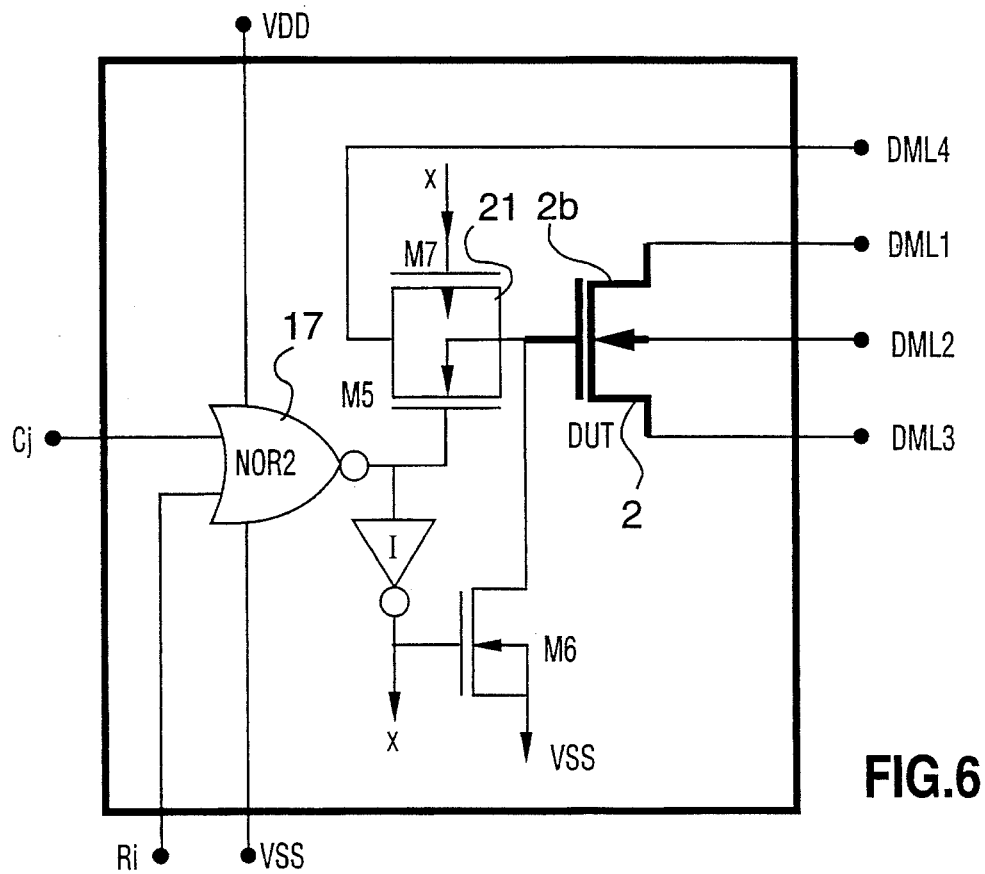
FIG. 6 is a more detailed block diagram of a second embodiment of an active device showing the enabling circuitry.
Figure 7:
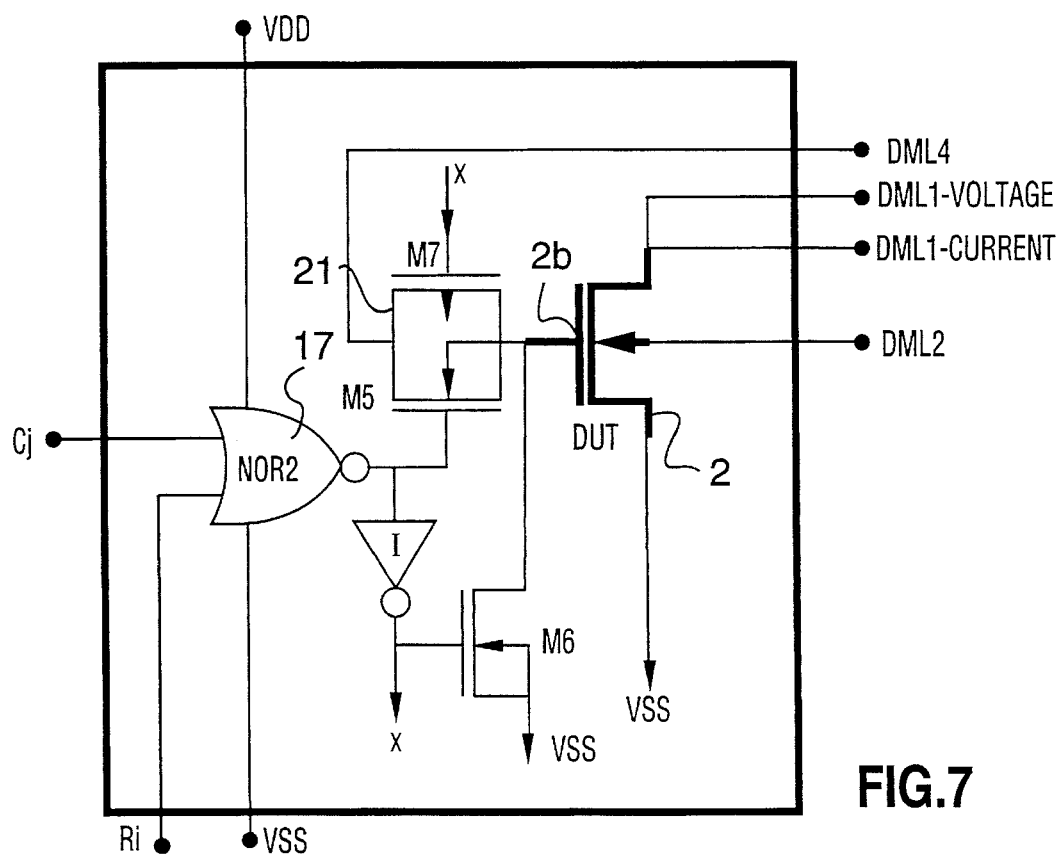
FIG. 7 is a more detailed block diagram of a third embodiment of an active device showing the enabling circuitry.

FIGS. 5 to 7 show examples of enabling circuitry within each matrix element in more detail.

In FIG. 5, the DUT 2 comprises a MOS transistor with its bulk (substrate), source, and gate contacts connected to DML lines DML2, DML3 and DML4. The drain of DUT 2 is connected to transmission gates 19, 20.

Lines $C_j$, $R_i$ are connected to NOR gate 17. Input line DML1 is connected through non-inverting input 18a operational amplifier 18, which can either be external or incorporated on the chip or external to it, to the transmission gate 19. Transmission gate 20 is connected to inverting input 18b of operational amplifier 18.

In operation, activation of lines $C_j$, $R_i$ enables NOR gate 17, which in turn enables the DUT 2 via its drain 2a. The transmission gates 19, 20 formed by transistors M1–M3 and M2–M4 are active (i.e. conducting) only when both $C_j$ and $R_i$ are active low. In this state, the DUT 2 is enabled and DML2 corresponds to the bulk contact, DML3 to the source, and DML4 to the gate. The input labelled DML1 is coupled to the drain of the DUT 2 via the operational amplifier 18. This has a high gain and a high input impedance so as to ensure that the drain of the DUT 2 is at the voltage of the input DML1.

In the case where either or both $C_j$ and $R_i$ are high, the transmission gates 19, 20 are inactive. In this state the drain of the DUT is disconnected from DMLIa and DMLIb respectively at the output and non-inverting input of the operational amplifier 18.

The operational amplifier 18 also has a low offset voltage, low noise characteristics, high gain, and high input resistance.

For this enabling circuit the DUT 2 is enabled via its gate.

Referring now to FIG. 6, the transmission gate 21 formed by transistors M7–M5 conducts only when both $C_j$ and $R_i$ are active low. The transistor M6 under these conditions is pulled off. Consequently, the gate input, DML4 is active. In the case where either or both Cj and Ri are high, the transmission gate is inactive and the transistor M6 pulls the gate 2b of the DUT 2 to ground. In this state, the DUT 2 is disabled. In FIG. 7, the enabling circuit is similar to that shown in FIG. 6 except:

(i) DML1 has two lines—one for monitoring the drain voltage (high-impedance line) and the second to source current (low-impedance line).

(ii) The source of the DUT uses the VSS line (i.e. the ground line) of the test chip.

While described in connection with NMOS transistors, the invention is applicable to PMOS transistors, bipolar transistors, or all these types of transistors on one chip (NMOS, PMOS, and bipolar)

If required, extra components can be added for stability, obtaining better accuracy, or for input/output reasons. Different extraction schemes to those shown can of course be employed.

The chip can be used for semiconductor process qualification, to interface to a circuit simulator so as to extract crucial D.C. parameters during simulation (i.e. real time extraction), or to analyze the yield of the semiconductor process.

We claim:

1. A semiconductor test chip comprising:

a) a matrix of active semiconductor devices that can be individually tested, each active semiconductor device having a plurality n of terminals, where n is an integer greater than 2;

b) a group of n device measurement lines for connection to external test circuitry, n-1 of said device measurement lines being permanently connected to terminals on said active semiconductor devices, and a remaining one of said device measurement lines being connected to a remaining terminal of each active semiconductor device through switch means associated with each said active semiconductor device;

c) input means for receiving an instruction identifying a said active semiconductor device that it is desired to test;

d) decoder means comprising a row decoder and a column decoder incorporated into said chip, said row and column decoders each having enabling lines corresponding to rows and columns of said matrix respectively, and said row and column decoders identifying, in accordance with a said received instruction, a row and column respectively of said active semiconductor device that it is desired to test by activating the corresponding enabling lines thereof; and e) a logic gate associated with each said active semiconductor device and receiving at its inputs said enabling lines corresponding to the row and column of its active semiconductor device, said logic gate activating the switch means of its associated active semiconductor device in response to enablement of the enabling lines connected to its inputs to connect the remaining terminal of its associated active semiconductor device to the remaining device measurement line and thereby activate said associated active semiconductor device.

2. A semiconductor test chip as claimed in claim 1, wherein said switch means comprises at least one transmission gate.

3. A semiconductor test chip as claimed in claim 2, wherein said n-1 device measurement lines are permanently connected respectively to a source, drain and substrate of each said MOSFET, and the remaining device measurement line is connected through said transmission gate to a gate of each said MOSFET.

4. A semiconductor test chip as claimed in claim 3, wherein said logic gate also controls a transistor to enable and disable its associated semiconductor active device.

5. A semiconductor test chip as claimed in claim 2, wherein each said active semiconductor device is a MOSFET, and said logic gate also controls a transistor connected to a gate of said MOSFET for enabling said MOSFET when said logic gate activates said switch means associated therewith.

6. A semiconductor test chip as claimed in claim 5, wherein two of said n-1 device measurement lines, one being low impedance and the other being high impedance, are permanently connected to a same terminal of each said MOSFET.

7. A semiconductor test chip as claimed in claim 6, wherein said two of said n-1 device measurement lines are connected to a drain of said MOSFET.

8. A semiconductor test chip as claimed in claim 1, wherein said logic gate is a NOR gate, each said active semiconductor device is a MOSFET, and said switch means is a transmission gate connected to a drain of said MOSFET.

9. A semiconductor test chip as claimed in claim 8, further comprising, for each active semiconductor device, an operational amplifier having a first input connected to the remaining device measurement line, a second input connected through a second transmission gate to a drain of said MOSFET, and an output connected to said first-mentioned transmission gate, said logic circuit controlling both said transmission gates of each said active semiconductor device.

* * * * *